United States Patent
Chen et al.

(10) Patent No.: US 10,427,936 B2
(45) Date of Patent: Oct. 1, 2019

(54) METHOD OF PROCESSING NANO- AND MICRO-PORES

(71) Applicant: Guangdong University of Technology, Guangzhou, Guangdong (CN)

(72) Inventors: Yun Chen, Guangdong (CN); Xin Chen, Guangdong (CN); Dachuang Shi, Guangdong (CN); Jian Gao, Guangdong (CN); Zhengping Wang, Guangdong (CN); Haidong Yang, Guangdong (CN)

(73) Assignee: Guangdong University of Technology, Guangzhou (CN)

( * ) Notice: Subject to any disclaimer, the term of this patent is extended or adjusted under 35 U.S.C. 154(b) by 0 days.

(21) Appl. No.: 16/221,457

(22) Filed: Dec. 15, 2018

(65) Prior Publication Data

US 2019/0185319 A1 Jun. 20, 2019

(30) Foreign Application Priority Data

Dec. 15, 2017 (CN) .......................... 2017 1 1349542

(51) Int. Cl.
| | |
|---|---|
| *B81C 1/00* | (2006.01) |
| *B82Y 40/00* | (2011.01) |
| *H01L 21/306* | (2006.01) |
| *H01L 29/06* | (2006.01) |

(52) U.S. Cl.
CPC ...... *B81C 1/00373* (2013.01); *B81C 1/00849* (2013.01); *H01L 21/30604* (2013.01); *H01L 29/0665* (2013.01); *B82Y 40/00* (2013.01)

(58) Field of Classification Search
CPC combination set(s) only.
See application file for complete search history.

(56) References Cited

U.S. PATENT DOCUMENTS

| | | | | |
|---|---|---|---|---|
| 2010/0248449 | A1* | 9/2010 | Hildreth | B81C 1/00071 438/460 |
| 2014/0256078 | A1* | 9/2014 | Jin | B81C 1/00515 438/57 |
| 2015/0137321 | A1* | 5/2015 | Li | H01L 29/0665 257/618 |

FOREIGN PATENT DOCUMENTS

| | | |
|---|---|---|
| CN | 106270855 A | 1/2017 |
| CN | 107399716 A | 11/2017 |

* cited by examiner

*Primary Examiner* — Michelle Mandala
*Assistant Examiner* — Jordan M Klein
(74) *Attorney, Agent, or Firm* — Wayne & Ken, LLC; Tony Hom (57) ABSTRACT

A method of processing nano- and micro-pores includes washing a substrate and cleaning a surface of the substrate; spin-coating photoresist, exposing the substrate and developing to form the substrate with a pattern; 3. depositing micro-nano metal particles on the surface of the substrate; wherein the micro-nano metal particles are centered on a magnetic core; and the surface of the magnetic core is plated with a metal nano-particle coating composed of a plurality of gold, silver or aluminum nanoparticles; removing the photoresist, and maintaining dot arrays of the micro-nano metal particles; applying laser irradiation and a strong uniform magnetic field on the substrate, so that the substrate is processed to form processed structures; and after the processed structures being formed into nano-/micro-pores with targeted pore size, shape and depth, stopping the laser irradiation and removing the strong uniform magnetic field.

10 Claims, 6 Drawing Sheets

METHOD OF PROCESSING NANO- AND MICRO-PORES

CROSS-REFERENCE TO RELATED APPLICATIONS

This application claims priority from Chinese Patent Application No. CN201711349542.X, filed on Dec. 15, 2017, which is hereby incorporated by reference in its entirety.

TECHNICAL FIELD

The present disclosure relates to material processing, and more particularly to a method of processing nano- and micro-pores.

BACKGROUND

Micro- and nano-structures with small size and high precision can be processed as the micro-/nano-processing technology continues to improve. For example, solid-state nanopores are used in single DNA molecule analysis. The solid-state nanopores have significant advantages in terms to chemical, thermal and mechanical stabilities compared to conventional bio-nanopores for single DNA molecule analysis, and can be manufactured by conventional micro-/nano-processing techniques. As such, nanopores can be processed in a large scale, and pore size can be precisely controlled. Therefore, many researchers keep focusing on the processing of the solid-state nanopores and study the movement of biomolecules in the solid-state nanopores.

Current-carrying electrons on gold nanoparticles or gold nanorods will continuously oscillate when exposed to visible light and near-infrared light, resulting in local plasmon resonance on the surface of gold nanoparticles or gold nanorods. Such local plasmon resonance gradually decays in the form of radiation and non-radiation, and the latter can heat tiny particles to form hot spot with temperature up to 2000° C. This effect has been applied to the processing of nanopores on materials such as glass, polyethylene terephthalate.

However, there exists a difficulty that the diameters of gold nanoparticles are required to be much smaller than the wavelength of light, enabling the gold nanoparticles to absorb the energy of light as efficiently as possible and to generate a high-temperature hot spot for eliminating the materials. Therefore, gold nanoparticles with a diameter of 10-100 nm are usually processed. Accordingly, the diameter of the processed nanopores is also strictly limited to 10-100 nm. In addition, the motion trajectory of gold nanoparticles is random to some extent since the gold nanoparticles are affected by the evaporation of the substrate during processing. Thus, it is very challenging to control the motion trajectory of gold nanoparticles during processing so as to process the gold nanoparticles into shape-controllable pores. In summary, there is a need for a new solution to controllably process nanopores above 100 nm.

SUMMARY

The object of the present application is to provide a method of processing nano- and micro-pores. The method can process blind holes or through holes of any shape with a pore size of micrometers or of 100 nm or more. The process is environmentally friendly and is simple to operate, and the pore size, shape and depth in processing are controllable.

The method of processing nano- and micro-pores includes:

step 1: washing a substrate with deionized water, and cleaning a surface of the substrate with a plasma cleaner;

step 2: spin-coating photoresist on the substrate, then exposing the substrate and developing to form the substrate with a pattern;

step 3: depositing micro-nano metal particles on the surface of the substrate; wherein the micro-nano metal particles are centered on a magnetic core; and the surface of the magnetic core is plated with a metal nano-particle coating comprising a plurality of gold, silver or aluminum nanoparticles;

step 4: removing the photoresist, and maintaining dot arrays of the micro-nano metal particles deposited on the surface of the substrate;

step 5: exposing the substrate with surface deposited with the micro-nano metal particles using laser irradiation and applying a strong uniform magnetic field in a reaction chamber; wherein the magnetic core in the micro-nano metal particles guided by the strong uniform magnetic field drives the micro-nano metal particles to directionally move on the substrate, so that the substrate is processed to form processed structures;

step 6: after the processed structures being formed into nano-/micro-pores of target pore size, shape and depth, stopping the laser irradiation and removing the strong uniform magnetic field to obtain the finished product.

In the method of processing nano- and micro-pores of the present invention, the micro-nano metal particles deposited on the surface of the substrate are exposed to laser irradiation to generate surface plasmon resonance on the surface of the metal nano-particle coating which is coated on the surface of the micro-nano metal particles and comprises a plurality of gold, silver or aluminum nanoparticles, so that the energy of laser is absorbed and converted into a small hotspot. The plurality of gold, silver or aluminum nanoparticles are accumulated on the surface of the micro-nano metal particles since they are centered on the magnetic core, and therefore small hotspots formed by single gold nanoparticle are combined into a large hotspot allowing the substrate in contact with the micro-nano metal particles to be evaporated. At the same time, a strong uniform magnetic field is applied to drive the micro-nano metal particles to directionally move on the substrate. Thus the substrate can be continuously processed the in a controllable and effective way until a nano- or micro-sized blind hole or through hole corresponding to the diameter of the micro-nano composite metal particle is formed.

The present method overcomes the limit that the laser can only excite gold, silver or aluminum nanoparticles with a diameter much smaller than the wavelength of the light to generate plasmon resonance. That is, with the magnetic core of the micro-nano metal particles, a plurality of gold nanoparticles with a diameter less than 100 nm are accumulated together and are able to generate plasmon resonance, and the effective motion of the micro-nano metal particles is guided by the magnetic field to process blind holes or through holes of any shape and with pore sizes above 100 nm or of micrometers. Contaminating reagents such as chemical electrolyte are not required and the present process is simple to operate to control pore size, shape and depth. The method is promising in biodetection, microfluidic devices and electronic manufacturing applications.

Further, the substrate in step 1 is a plate material of glass or polyethylene terephthalate (PET).

Further, in steps 2 and 3, an area on the surface of the substrate where the micro-nano metal particles are deposited is controlled according to an exposed pattern. In this way, shape (i.e., circular, square, etc.) and pore size of the processed nano-/micro-pores can be more effectively and precisely controlled.

Further, the magnetic core is any one of spherical iron particles, iron compound particles, nickel particles, nickel compound particles, cobalt particles and cobalt compound particles having a radius of 50-1000 nm, and the metal nano-particle coating is formed by gold nanoparticles having a diameter of 10-100 nm or composite particles of gold nanorods having a length of 10-50 nm and a width of 1-10 nm. A metal nano-particle coating with a certain size and a stable structure is sintered and formed on the surface of the magnetic core with a certain radius, and the diameters of the micro-nano metal particles are effectively controlled, thereby controlling the pore size, shape and depth in processing more precisely.

Further, in step 5, laser in the laser irradiation has a wavelength of 350-2000 nm, and the strong uniform magnetic field is generated by a permanent magnet or an alternating coil.

Further, in step 5, when the processed structures are straight holes, the strong uniform magnetic field applied in the reaction chamber is perpendicular to the surface of the substrate.

Further, in step 5, when the processed structures are oblique holes, the strong uniform magnetic field applied in the reaction chamber forms an included angle α with the surface of the substrate; and the included angle α is equal to the angle of the oblique holes.

Further, in step 5, when the processed structures are channels with axes parallel to the surface of the substrate, the strong uniform magnetic field applied in the reaction chamber is parallel to the surface of the substrate.

Further, in step 5, when the processed structures are bent channels, the strong uniform magnetic field with different directions is alternately applied in the reaction chamber. According to the structural characteristics of different processed structures, the nano-/micro-pores with different pore sizes, shapes and depths can be processed by adjusting the positional relationship between the substrate and the strong uniform magnetic field, and the operation is controllable and convenient. For example, the strong uniform magnetic field perpendicular to the surface of the substrate is used to process the straight holes; the strong uniform magnetic field formed an included angle α with the surface of the substrate is used to process the oblique holes; the strong uniform magnetic field parallel to the surface of the substrate is used to process the channels with the axes parallel to the surface of the substrate; and the strong uniform magnetic field with different directions are alternately applied to process the different bent channels.

Further, in step 5, the processing speed for the processed structures is 5-50 nm/min. According to the processing speed of 5-50 nm/min, the time for processing the nano-/micro-pores of target pore size, shape and depth is calculated, so that the laser irradiation is stopped and the strong uniform magnetic field is removed timely.

The present invention has the following beneficial effects:
The present method overcomes the limit that the laser can only excite gold, silver or aluminum nanoparticles having a diameter much smaller than the wavelength of light to generate plasmon resonance. That is, with the magnetic core of the micro-nano metal particles, a plurality of gold nanoparticles with a diameter less than 100 nm are accumulated together and are able to generate plasmon resonance, and the effective motion of the micro-nano metal particles is guided by the magnetic field to process blind holes or through holes of any shape and with pore sizes above 100 nm or of micrometers. Contaminating reagents such as chemical electrolyte are not required and the present process is simple to operate to control pore size, shape and depth. The method is promising in biodetection, microfluidic devices and electronic manufacturing applications.

Reference numerals: 101, cleaned substrate; 102 substrate spin-plated with photoresist; 103, exposed and developed substrate; 104, substrate deposited with micro-nano metal particles; 106, micro-nano metal particles; 301, laser; 302, strong uniform magnetic field; 303, substrate with surface deposited with micro-nano metal particles; 401, laser; 402, strong uniform magnetic field; 404, substrate; 501, laser; 502, strong uniform magnetic field forming an included angle α with the surface of substrate; 503, substrate with surface deposited with micro-nano metal particles; 601, laser; 602, strong uniform magnetic field forming an included angle α with the surface of substrate; 604, substrate; 701, laser; 702, strong uniform magnetic field perpendicular to the surface of substrate; 704, substrate; 705, strong uniform magnetic field parallel to the surface of substrate.

DETAILED DESCRIPTION OF EMBODIMENTS

The technical solutions of the present application will be further described below in conjunction with the accompanying drawings and the embodiments.

Embodiment 1

Figure 1:
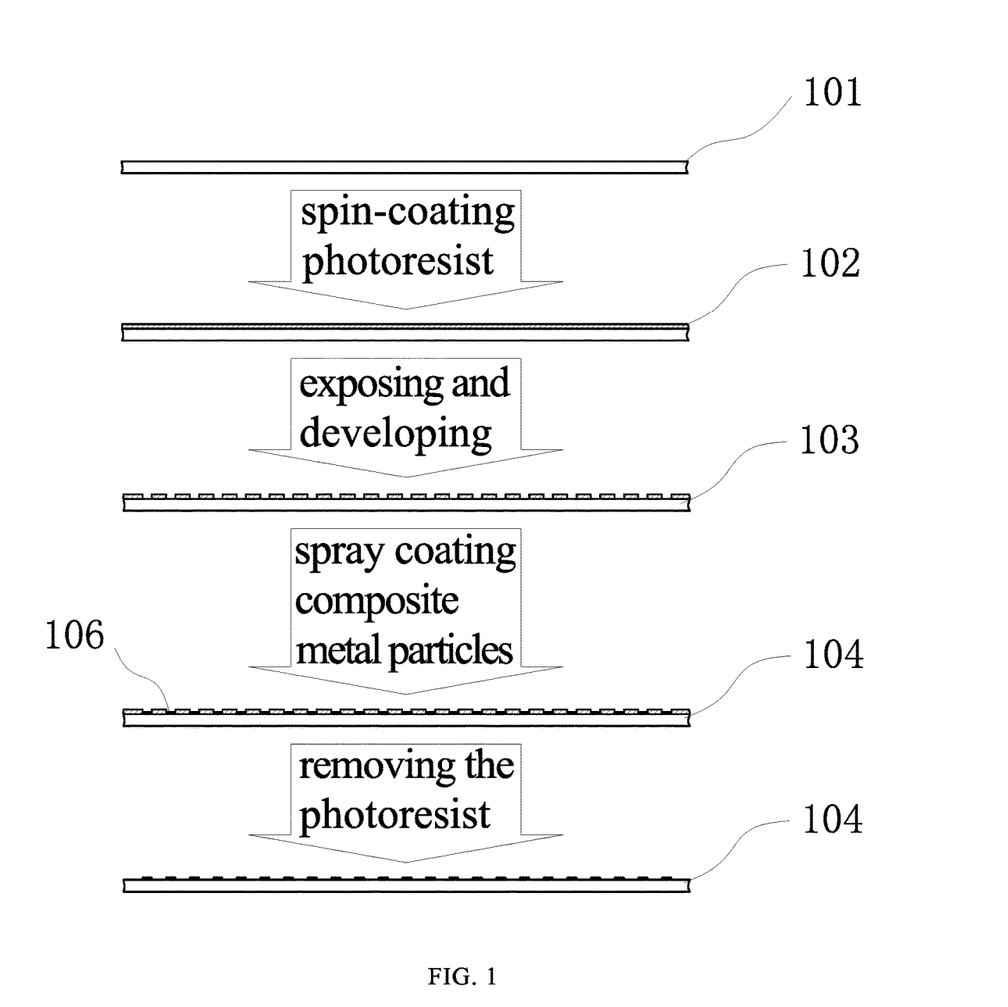
FIG. 1 is a flow diagram showing spin-coating photoresist on a cleaning substrate, exposing, developing and depositing micro-nano metal particles and removing the photoresist.

Step 1: A substrate 101 was washed with deionized water, and the surface of the substrate was cleaned with a plasma cleaner. The substrate 101 was a plate material of polyethylene terephthalate (PET).

Step 2: Photoresist 102 was spin-coated on the substrate 101, and then the substrate 101 was exposed and developed to form a substrate 103 printed with a target pattern.

Figure 2:
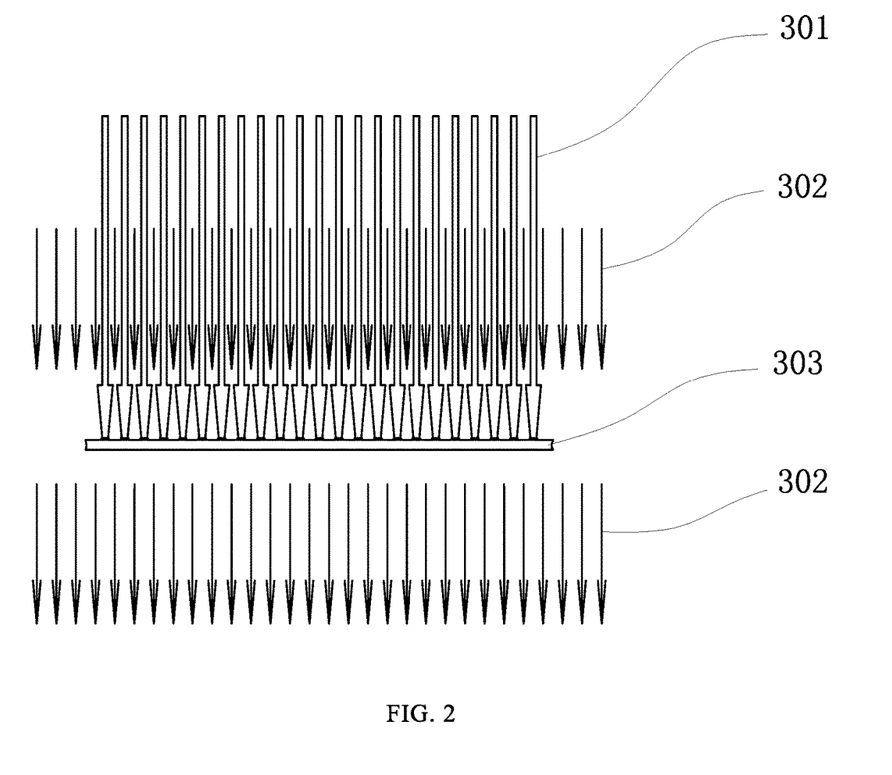
FIG. 2 is a schematic diagram showing the processing of straight holes by means of laser irradiation and a strong uniform magnetic field.

Step 3: Micro-nano metal particles 106 were deposited on the surface of the substrate. That is, according to the exposed pattern, the area on the surface of the substrate deposited with the micro-nano metal particles 106 was controlled, thereby controlling the shape (such as circle, square, etc.)

and pore size of the nano-/micro-pores. The micro-nano metal particles 106 were centered on a magnetic core 201, and the surface of the magnetic core was plated with a metal nano-particle coating composed of a plurality of gold, silver or aluminum nanoparticles. The magnetic core was any one of spherical iron particles, iron compound particles, nickel particles, nickel compound particles, cobalt particles and cobalt compound particles having a radius of 50 nm, and the metal nano-particle coating was formed by gold nanoparticles having a diameter of 10 nm or composite particles of gold nanorods having a length of 10 nm and a width of 1 nm as shown in FIG. 2.

Step 4: The photoresist was removed, and dot arrays of the micro-nano metal particles deposited on the surface of the substrate were maintained to obtain a substrate 104 deposited with the micro-nano metal particles.

Figure 3:
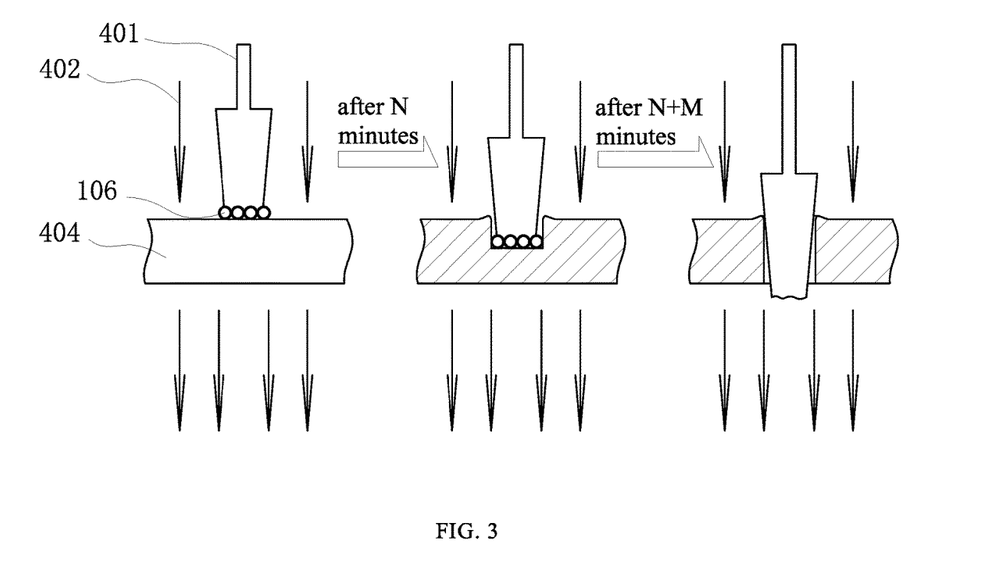
FIG. 3 is a schematic diagram showing the processing of straight holes.

Step 5: The substrate 303 with the surface deposited with the micro-nano metal particles was irradiated by laser 301 with the wavelength of 350 to 2000 nm. The strong uniform magnetic field 302 perpendicular to the surface of the substrate was applied in a reaction chamber as shown in FIG. 3. The magnetic core of the micro-nano metal particles guided by the strong uniform magnetic field drove the micro-nano metal particles to directionally move on the substrate, so that the substrate was processed to form the processed structures.

Figure 4:
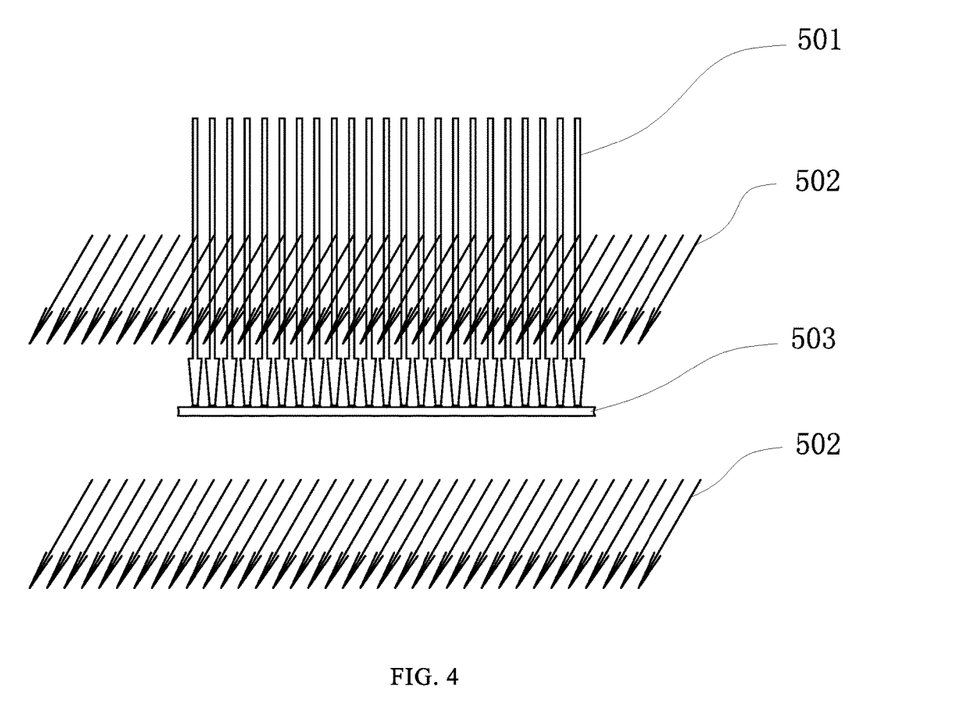
FIG. 4 is a schematic diagram showing the processing of oblique holes by means of laser irradiation and a strong uniform magnetic field.

Step 6: The processing time was calculated according to the processing speed of the processed structures being 5-50 nm/min. After the straight nanopores of target pore size, shape and depth were processed on the substrate 404 as shown in FIG. 4, the irradiation by the laser 401 was stopped and the strong uniform magnetic field 402 was removed to obtain the finished product.

Embodiment 2

Step 1: A substrate 101 was washed with deionized water, and the surface of the substrate was cleaned with a plasma cleaner. The substrate 101 was a plate material of glass.

Step 2: Photoresist 102 was spin-coated on the substrate 101, and then the substrate 101 was exposed and developed to form a substrate 103 printed with a targeted pattern.

Step 3: Micro-nano metal particles 106 were deposited on the surface of the substrate. That is, according to the exposed pattern, the area on the surface of the substrate deposited with the micro-nano metal particles 106 was controlled, thereby controlling the shape (such as circle, square, etc.) and pore size of the nano-/micro-pores. The micro-nano metal particles 106 were centered on a magnetic core 201, and the surface of the magnetic core was plated with a metal nano-particle coating composed of a plurality of gold, silver or aluminum nanoparticles. The magnetic core was any one of spherical iron particles, iron compound particles, nickel particles, nickel compound particles, cobalt particles and cobalt compound particles having a radius of 1000 nm, and the metal nano-particle coating was formed by gold nanoparticles having a diameter of 100 nm or composite particles of gold nanorods having a length of 50 nm and a width of 10 nm.

Step 4: The photoresist was removed, and dot arrays of the micro-nano metal particles deposited on the surface of the substrate were maintained to obtain a substrate 104 deposited with the micro-nano metal particles.

Figure 5:
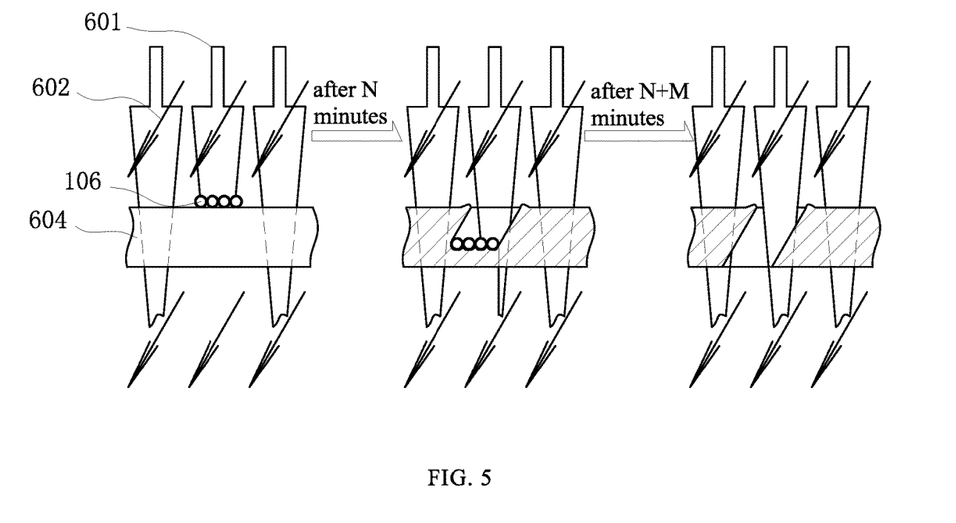
FIG. 5 is a schematic diagram showing the processing of oblique holes.

Step 5: The substrate 503 with the surface deposited with the micro-nano metal particles was irradiated by laser 501 with the wavelength of 350 to 2000 nm. The strong uniform magnetic field 502 formed an included angle α with the surface of the substrate was applied in a reaction chamber as shown in FIG. 5. The magnetic core of the micro-nano metal particles guided by the strong uniform magnetic field drove the micro-nano metal particles to directionally move on the substrate, so that the substrate was processed to form the processed structures.

Figure 6:
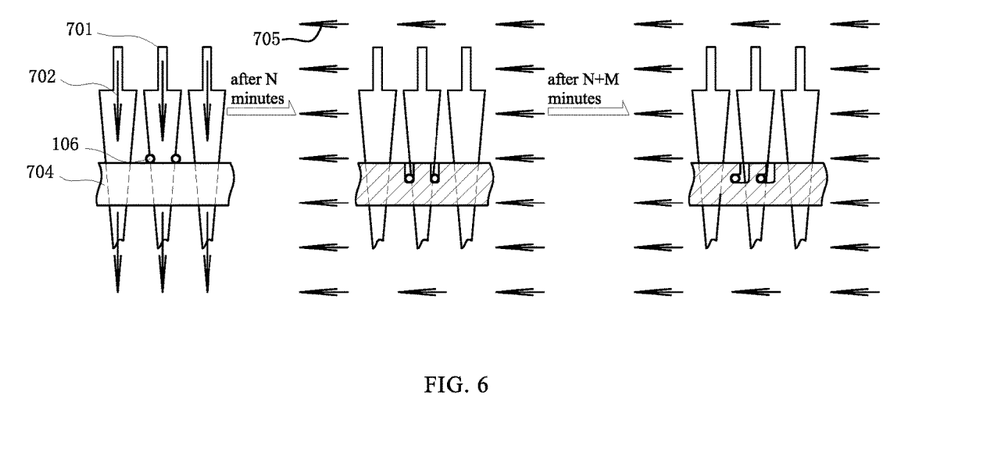
FIG. 6 is a schematic diagram showing the processing of pores and bent channels by means of laser irradiation and a strong uniform magnetic field.

Step 6: The processing time was calculated according to the processing speed of the processed structures being 5-50 nm/min. As shown in FIG. 6, after the nanopores of target pore size, shape and depth were processed on the substrate 604, and the axes of the nanopores were formed an included angle α with the surface of the substrate, the irradiation by the laser 601 was stopped and the strong uniform magnetic field 602 was removed to obtain the finished product.

Embodiment 3

Step 1: A substrate 101 was washed with deionized water, and the surface of the substrate was cleaned with a plasma cleaner. The substrate 101 was a plate material of glass.

Step 2: Photoresist 102 was spin-coated on the substrate 101, and then the substrate 101 was exposed and developed to form a substrate 103 printed with a targeted pattern.

Step 3: Micro-nano metal particles 106 were deposited on the surface of the substrate. That is, according to the exposed pattern, the area on the surface of the substrate deposited with the micro-nano metal particles 106 was controlled, thereby controlling the shape (such as circle, square, etc.) and pore size of the nano-/micro-pores. The micro-nano metal particles 106 were centered on a magnetic core 201, and the surface of the magnetic core was plated with a metal nano-particle coating composed of a plurality of gold, silver or aluminum nanoparticles. The magnetic core was any one of spherical iron particles, iron compound particles, nickel particles, nickel compound particles, cobalt particles and cobalt compound particles having a radius of 500 nm, and the metal nano-particle coating was formed by gold nanoparticles having a diameter of 50 nm or composite particles of gold nanorods having a length of 25 nm and a width of 5 nm.

Step 4: The photoresist was removed, and dot arrays of the micro-nano metal particles deposited on the surface of the substrate were maintained to obtain a substrate 104 deposited with the micro-nano metal particles.

Step 5: The substrate 704 with the surface deposited with the micro-nano metal particles was irradiated by laser 701 with the wavelength of 350 to 2000 nm. The strong uniform magnetic field 702 perpendicular to the surface of the substrate was applied in a reaction chamber. The magnetic core of the micro-nano metal particles guided by the strong uniform magnetic field drove the micro-nano metal particles to directionally move on the substrate, so that the substrate was processed to form the processed structures.

Step 6: The processing time was calculated according to the processing speed of the processed structures being 5-50 nm/min. After the straight nanopores of target pore size, shape and depth were processed on the substrate, the strong uniform magnetic field 705 parallel to the surface of the substrate was alternately applied to driving the micro-nano metal particles to move along the direction parallel to the surface of the substrate, so that the channels parallel to the surface of the substrate were processed.

Step 7: After the bent channels of target pore size, shape and depth were obtained on the substrate 704, the irradiation by the laser 701 was stopped and the strong uniform magnetic field was removed to obtain the finished product.

The technical principles of the present invention have been described above in conjunction with embodiments, which are only illustrative of, but not to limit, the present invention. Based on the explanation herein, any other embodiments made by those skilled in the art without creative work should fall in the scope of the present disclosure.

What is claimed is:

1. A method of processing nano- or micro-pores, comprising:
    step 1: washing a substrate with deionized water, and cleaning a surface of the substrate with a plasma cleaner;
    step 2: spin-coating photoresist on the substrate, and then exposing the substrate and developing to form the substrate with a pattern;
    step 3: depositing micro-nano metal particles on the surface of the substrate; wherein the micro-nano metal particles are centered on a magnetic core, and a surface of the magnetic core is plated with a metal nano-particle coating composed of a plurality of gold, silver or aluminum nanoparticles;
    step 4: removing the photoresist and maintaining dot arrays of the micro-nano metal particles deposited on the surface of the substrate;
    step 5: exposing the substrate with surface deposited with the micro-nano metal particles using laser irradiation and applying a strong uniform magnetic field in a reaction chamber; wherein the magnetic core in the micro-nano metal particles guided by the strong uniform magnetic field drives the micro-nano metal particles to directionally move on the substrate, so that the substrate is processed to form processed structures;
    step 6: after the processed structures being formed with nano- or micro-pores of target pore size, shape and depth, stopping the laser irradiation and removing the strong uniform magnetic field to obtain a finished product.

2. The method of claim 1, wherein in step 1, the substrate is a plate material of glass or polyethylene terephthalate (PET).

3. The method of claim 1, wherein in steps 2 and 3, an area on the surface of the substrate where the micro-nano metal particles are deposited is controlled according to an exposed pattern.

4. The method of claim 1, wherein the magnetic core is any one of spherical iron particles, iron compound particles, nickel particles, nickel compound particles, cobalt particles and cobalt compound particles having a radius of 50-1000 nm; and the metal nano-particle coating is formed by gold nanoparticles having a diameter of 10-50 nm or composite particles of gold nanorods having a length of 10 to 50 nm and a width of 1-10 nm.

5. The method of claim 1, wherein in step 5, laser in the laser irradiation has a wavelength of 350-2000 nm; and the strong uniform magnetic field is generated by a permanent magnet or an alternating coil.

6. The method of claim 1, wherein in step 5, when the processed structures are straight holes, the strong uniform magnetic field applied in the reaction chamber is perpendicular to the surface of the substrate.

7. The method of claim 1, wherein in step 5, when the processed structures are oblique holes, the strong uniform magnetic field applied in the reaction chamber forms an included angle $\alpha$ with the surface of the substrate; and the included angle $\alpha$ is equal to an angle of the oblique holes.

8. The method of claim 1, wherein in step 5, when the processed structures are channels with axes parallel to the surface of the substrate, the strong uniform magnetic field applied in the reaction chamber is parallel to the surface of the substrate.

9. The method of claim 1, wherein in step 5, when the processed structures are bent channels, the strong uniform magnetic field with different directions is alternately applied in the reaction chamber.

10. The method of claim 1, wherein in step 5, a processing speed for the processed structures is 5-50 nm/min.

* * * * *